US006977204B1

United States Patent
Joo

(10) Patent No.: US 6,977,204 B1
(45) Date of Patent: Dec. 20, 2005

(54) METHOD FOR FORMING CONTACT PLUG HAVING DOUBLE DOPING DISTRIBUTION IN SEMICONDUCTOR DEVICE

(75) Inventor: Sung-Jae Joo, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/614,513

(22) Filed: Jul. 8, 2003

(30) Foreign Application Priority Data

Sep. 25, 2002 (KR) .................. 10-2002-0058102

(51) Int. Cl.$^7$ ........................................... H01L 21/283
(52) U.S. Cl. .................. 438/430; 438/219; 438/221; 438/295; 438/296; 438/404; 438/420; 438/433; 438/451; 438/519; 438/523; 438/527; 438/532; 438/533; 438/652; 438/675; 438/761; 438/914; 438/961
(58) Field of Search ...................... 438/199, 219, 438/221, 295, 296, 404, 420, 430, 433, 449, 438/451, 514, 519, 523, 527, 532, 533, 586, 438/652, 675, 761, 914, 961, FOR 150, FOR 161, 438/FOR 187, FOR 196

(56) References Cited

U.S. PATENT DOCUMENTS

| | | | | |
|---|---|---|---|---|
| 4,216,574 A | * | 8/1980 | Feist ........................... | 438/146 |
| 4,256,514 A | * | 3/1981 | Pogge ......................... | 438/361 |
| 4,884,123 A | * | 11/1989 | Dixit et al. .................. | 257/751 |
| 4,960,732 A | * | 10/1990 | Dixit et al. .................. | 438/628 |
| 5,086,016 A | * | 2/1992 | Brodsky et al. ............ | 438/369 |
| 5,091,321 A | * | 2/1992 | Huie et al. .................. | 438/234 |
| 5,710,059 A | * | 1/1998 | Rottner ....................... | 438/547 |
| 6,110,789 A | * | 8/2000 | Rhodes et al. .............. | 438/305 |
| 6,187,630 B1 | * | 2/2001 | Chen et al. .................. | 438/255 |
| 6,187,659 B1 | * | 2/2001 | Ying et al. .................. | 438/618 |
| 6,225,214 B1 | * | 5/2001 | Lin ............................. | 438/629 |
| 6,410,353 B1 | * | 6/2002 | Tsai ............................ | 438/14 |
| 6,424,038 B1 | * | 7/2002 | Bao et al. .................... | 257/741 |
| 6,444,536 B2 | * | 9/2002 | Wylie .......................... | 438/341 |
| 6,613,670 B2 | * | 9/2003 | Rha et al. .................... | 438/657 |
| 6,649,517 B2 | * | 11/2003 | Teh et al. .................... | 438/640 |
| 2003/0224598 A1 | * | 12/2003 | Lee at el. .................... | 438/666 |

FOREIGN PATENT DOCUMENTS

JP        2002-198500        7/2002

* cited by examiner

*Primary Examiner*—George Fourson
*Assistant Examiner*—Joannie Adelle Garcia
(74) *Attorney, Agent, or Firm*—Mayer, Brown, Rowe & Maw LLP

(57) ABSTRACT

The present invention provides a method for forming a contact plug in a semiconductor device capable of preventing an increase of contact resistance caused by a decrease in dopant concentration and suppressing diffusions of dopants implanted into the contact. The dopants are doped in a manner to allow the conductive layer to have different doping distributions with respect to a thickness. Particularly, the dopants are doped until reaching a target deposition thickness by gradually increasing a concentration of the dopants from a first concentration to a second concentration for an interval from an initial deposition of the conductive layer to the target deposition thickness, and the second concentration is consistently maintained throughout for an interval from the target deposition thickness to a complete deposition thickness.

14 Claims, 5 Drawing Sheets

METHOD FOR FORMING CONTACT PLUG HAVING DOUBLE DOPING DISTRIBUTION IN SEMICONDUCTOR DEVICE

FIELD OF THE INVENTION

The present invention relates to a semiconductor device; and, more particularly, to a method for forming a contact plug in a semiconductor device.

DESCRIPTION OF RELATED ARTS

In a cell region of a dynamic random access memory (DRAM) device, a contact for making a connection between a pn junction of a substrate and a capacitor or between a pn junction of a substrate and a bit line, that is, a cell plug is generally made of a polysilicon layer.

In the cell plug (hereinafter referred as to polysilicon plug) using such polysilicon layer, an n-type dopant with a concentration greater than $1 \times 10^{20}$ dopants/cm$^3$ is used to increase electric conductivity. Phosphorous (P) is a commonly used n-type dopant.

FIG. 1 is a cross-sectional view showing a semiconductor device having a conventional contact plug structure.

As shown, each gate line including a gate oxide layer 12, a gate electrode 13 and a hard mask 14 sequentially stacked on a substrate 11 is spaced apart from each other with a predetermined distance, whereby a number of the gate lines are formed. An insulating spacer 15 is subsequently formed at lateral sides of the gate line.

A contact isolation layer 16 for insulating and isolating neighboring plugs fills a space between the gate lines as exposing the substrate 11. A polysilicon plug 17 is buried into a space between the gate lines provided by the contact isolation layer 16.

In FIG. 1, the polysilicon plug 17, which is a contact plug, is deposited through the use of a low pressure chemical vapor deposition (LPCVD) technique. Also, such gas as $SiH_4$, $SiH_2Cl_2$ and the like is used while proceeding the above deposition procedure at a temperature ranging from about 500° C. to about 600° C. Concurrently, an n-type dopant, e.g., P, is doped by using $PH_3$ gas.

A polysilicon germanium plug is also used as a contact plug. At this time, such gas as $GeH_4$, $GeH_2Cl_2$ or $Ge_2H_6$ is added to the $SiH_4$, $SiH_2Cl_2$ and the like.

As described in the above, $PH_3$ gas is used to dope P in accordance with the prior art. As a flow quantity of the $PH_3$ gas increases, a concentration of P within the polysilicon plug 17 also increases. Conversely, the concentration of P decreases in case of decreasing the flow quantity of the $PH_3$ gas. Generally, the concentration of P within the polysilicon plug 17 is maintained consistently above $1 \times 10^{20}$ dopants/cm$^3$ throughout the whole thickness. The reason for maintaining this high concentration is to increase electric conductivity of the polysilicon plug 17.

FIG. 2 is a graph showing a doping distribution of P with respect to a thickness of the polysilicon plug illustrated in FIG. 1.

As shown, a doping concentration of P within the polysilicon plug consistently maintains a high concentration C although a thickness T of the polysilicon plug increases.

However, as a device size becomes increasingly smaller, it is also increasingly necessary to form a shallow junction. Therefore, there occur diffusions of P into a substrate while proceeding a thermal process after forming the polysilicon plug.

Accordingly, it is necessary to decrease the doping concentration of P within the polysilicon plug as simultaneously as to decrease a temperature and operation time of the thermal process in order to suppress the diffusions of P.

However, in case of uniformly decreasing the doping concentration of P within the whole polysilicon plug, electric conductivity of the polysilicon plug is also decreased, further resulting in an increase of the polysilicon plug resistance. Eventually, device properties are degraded.

SUMMARY OF THE INVENTION

It is, therefore, an object of the present invention to provide a method for forming a contact plug in a semiconductor device capable of suppressing diffusions of dopants implanted into a contact as simultaneously as of preventing an increase of contact resistance.

In accordance with an aspect of the present invention, there is provided a method for forming a contact plug in a semiconductor device, including the steps of: forming a contact isolation layer on a substrate, the contact isolation layer having an opening exposing a partial portion of the substrate; depositing a conductive layer within the opening of the contact isolation layer; doping dopants in a manner to allow the conductive layer to have different doping distributions with respect to a thickness; and forming a contact plug within the opening through a planarization process applied to the conductive layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1:
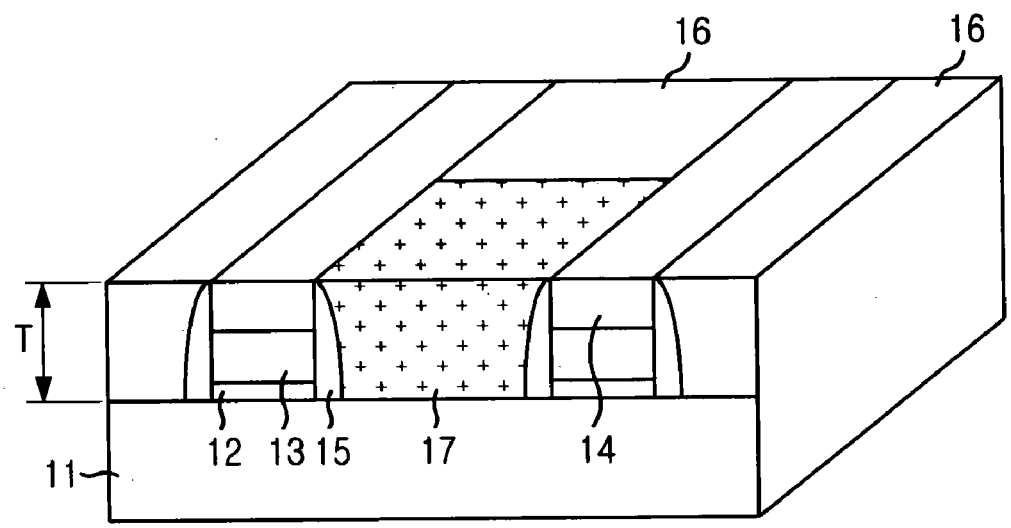
FIG. 1 is a prospective view illustrating a cell plug structure of a conventional semiconductor device.
Figure 2:
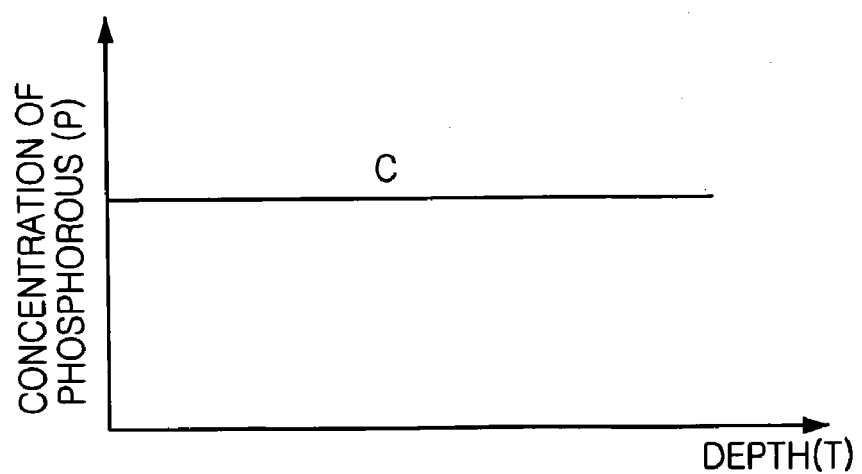
FIG. 2 is a graph showing a relationship between a doping concentration distribution and a thickness of the polysilicon plug illustrated in FIG. 1.
Figure 3:
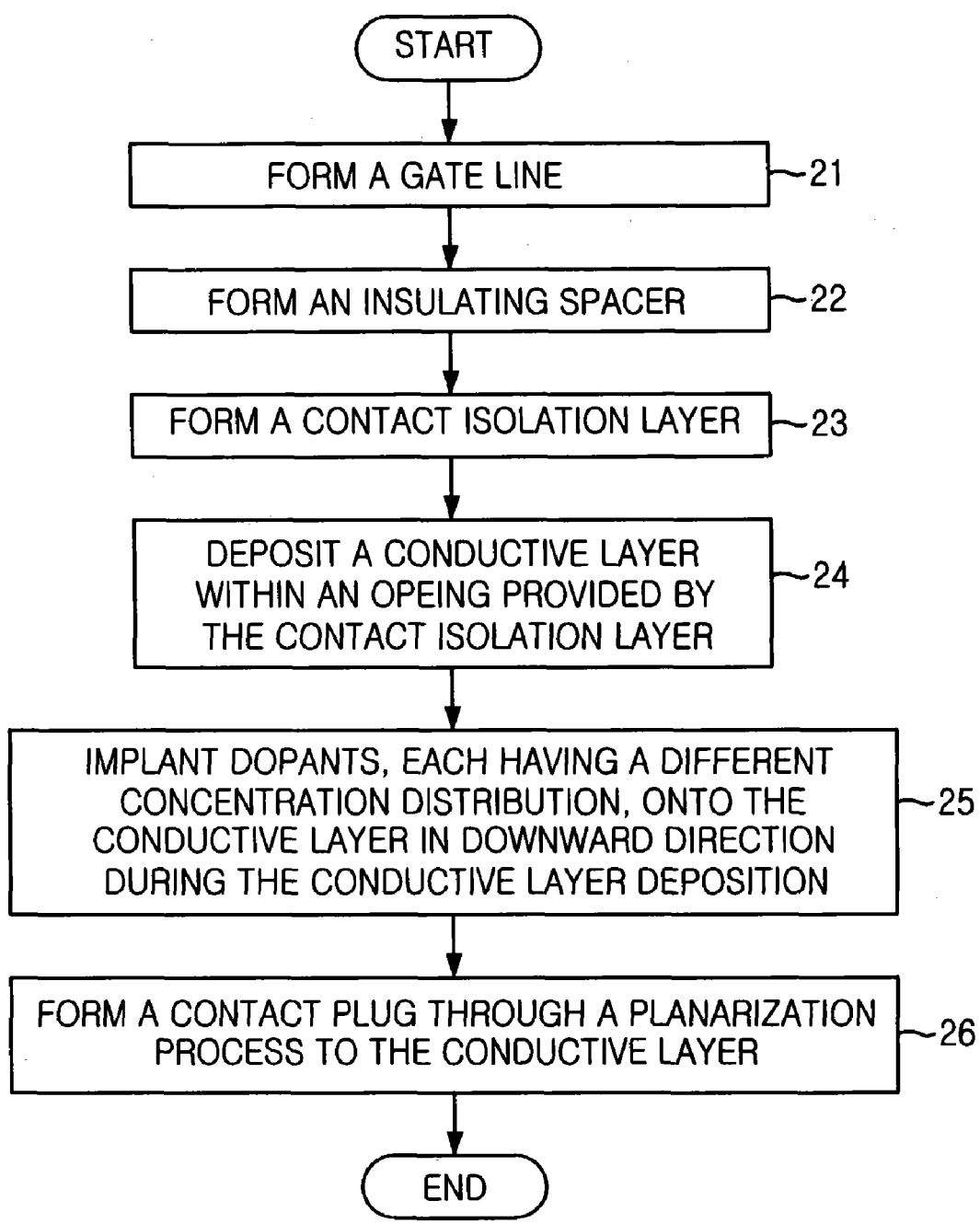
FIG. 3 is a flowchart showing procedures of a method for forming a contact plug in a semiconductor device in accordance with a preferred embodiment of the present invention.
Figure 4:
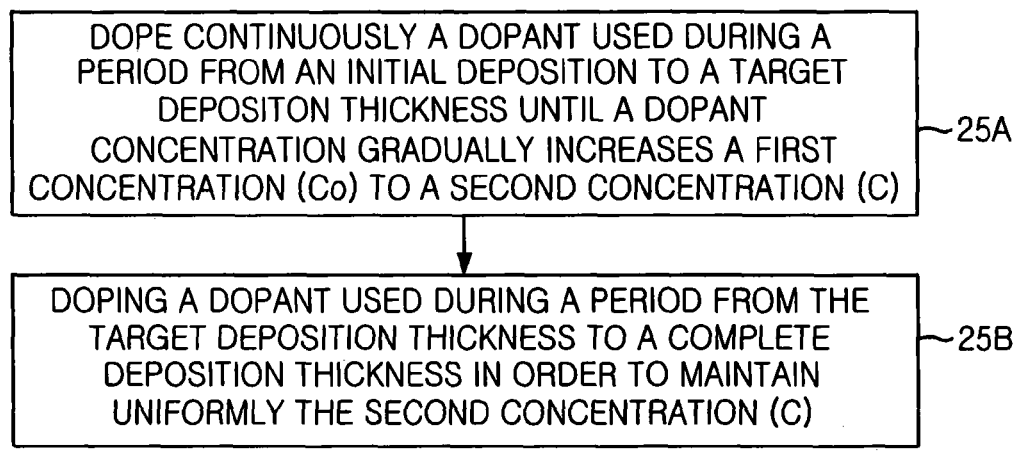
FIG. 4 is a flowchart showing procedures of implanting dopants in detail described in FIG. 3.
Figure 5:
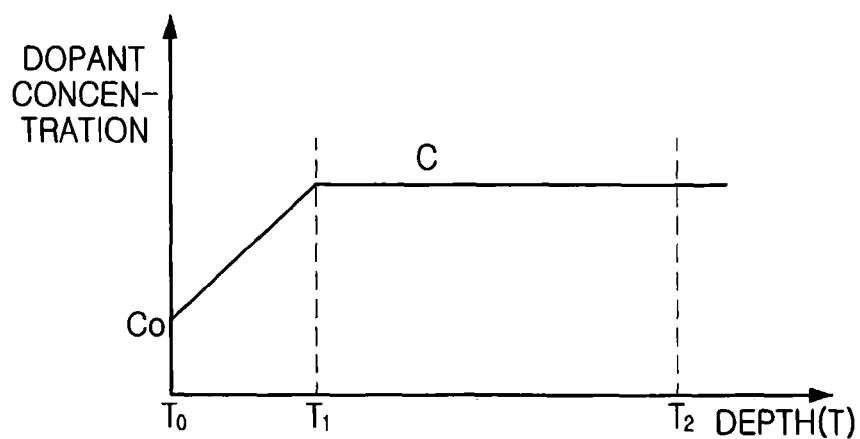
FIG. 5 is a graph showing a relationship between a dopant concentration distribution and a thickness of the contact plug described in FIG. 3.

FIG. 3 is a flowchart showing procedures of a method for forming a contact plug in a semiconductor device in accordance with a preferred embodiment of the present invention. Also, FIG. 4 is a flowchart showing detailed procedures for implanting dopants described in FIG. 3. FIG. 5 is a graph showing a relationship between a dopant concentration distribution and a thickness of the contact plug described in FIG. 3.

Referring to FIG. 3, the method for forming a contact plug in a semiconductor device includes a series of the steps as the following: they are, a gate line formation 21, an insulating spacer formation 22, a contact isolation layer formation 23, a conductive layer deposition 24 within an opening provided by the contact isolation layer, an implantation 25 of dopants having different distributions with respect to a thickness of the conductive layer and a contact plug formation 26 through planarization of the conductive layer.

Referring to FIGS. 4 and 5, the implantation of the dopants further includes: a first doping procedure 25A wherein dopants are doped until reaching a second concentration C by gradually increasing a doping concentration from a first concentration $C_0$ to a second concentration C for an interval between an initial conductive layer deposition thickness $T_0$ and a target deposition thickness $T_1$; and a second doping procedure 25B wherein the dopants are doped with a uniform concentration allowing the second concentration C to be consistently maintained for an interval from the target deposition thickness $T_1$ to a complete deposition thickness $T_2$.

To maintain a difference between the first and the second concentrations $C_0$ and C, a flow quantity of a doping gas used in the first doping procedure 25A is less than that of the doping gas used in the second doping procedure 25B. The flow quantity is gradually increased until the doping concentration reaches to the second concentration C from the first concentration $C_0$.

On the other hand, a flow quantity of the doping gas used in the second doping procedure 25B is larger than that of the doping gas used in the first doping procedure 25B. Also, the doping concentration is maintained consistent in order to maintain the second concentration C.

Meanwhile, the conductive layer deposition procedure 24 is proceeded by using a low pressure chemical vapor deposition (LPCVD) technique. That is, a polysilicon layer or a polysilicon germanium layer is deposited at a temperature ranging from about 500° C. to about 600° C. At this time, the target deposition thickness $T_1$ preferably ranges from about 500 Å to about 1000 Å if the complete deposition thickness $T_2$ of the conductive layer is assumed to be in a range from about 3000 Å to about 3500 Å.

Also, the first concentration $C_0$ ranges from about $5 \times 10^{18}$ dopants/cm$^3$ to about $1 \times 10^{20}$ dopants/cm$^3$, while the second concentration C ranges from about $1 \times 10^{20}$ dopants/cm$^3$ to about $3 \times 10^{20}$ dopants/cm$^3$. Herein, the first and the second concentrations $C_0$ and C are sufficient to increase electric conductivity of the contact plug.

PH$_3$ gas is used as the doping gas for implanting the dopants.

Figure 6A:
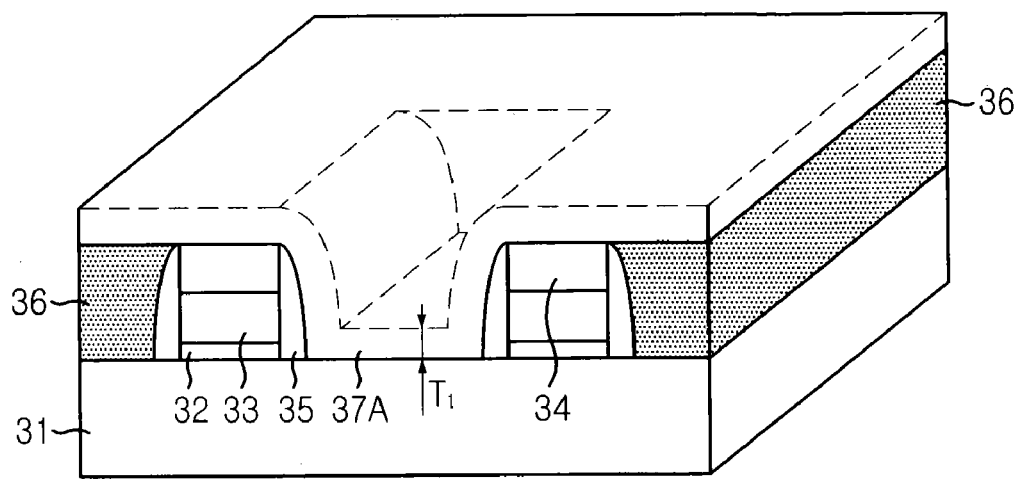
FIGS. 6A to 6C are prospective views showing a method for forming a polysilicon plug in accordance with the procedures described in FIG. 3.
Figure 6B:
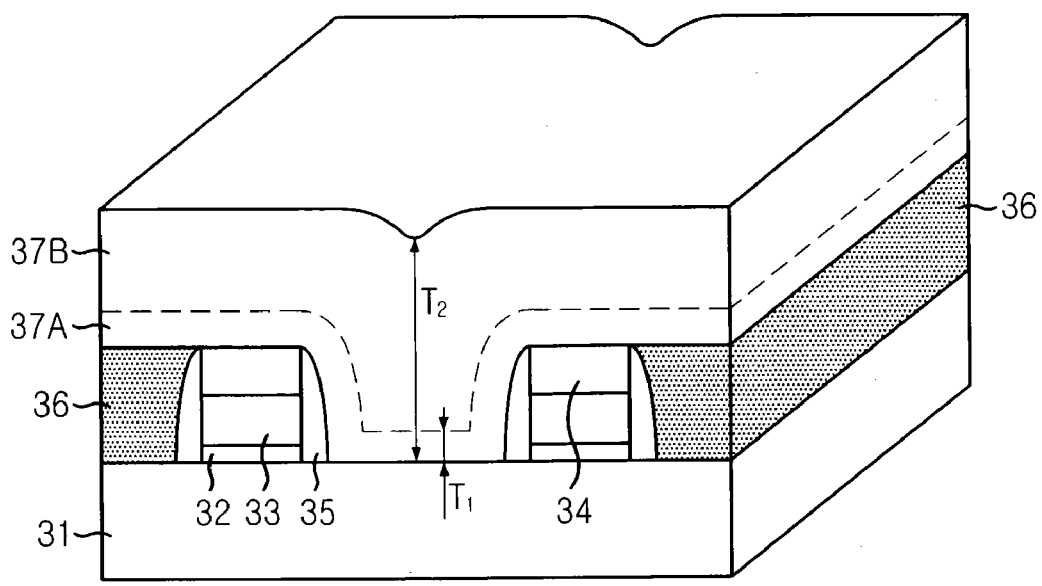
Figure 6C:
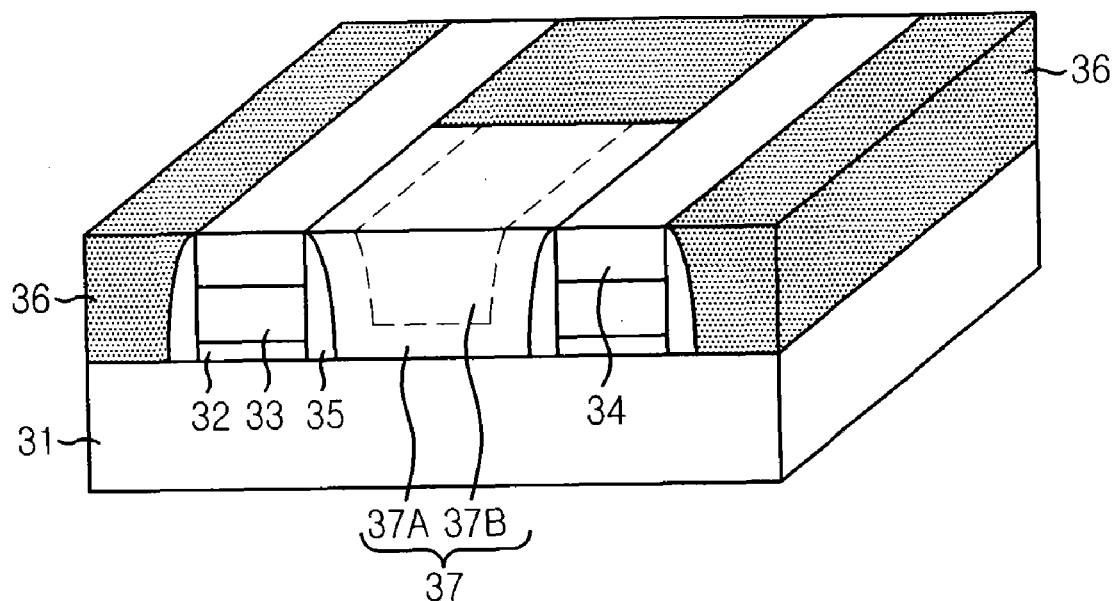

FIGS. 6A to 6C are prospective views showing a method for forming the polysilicon plug described in FIG. 3.

Referring to FIG. 6A, each gate line including a gate oxide layer 32, a gate electrode 33 and a hard mask 34 sequentially deposited on a substrate 31 is spaced apart from each other with a predetermined distance, whereby a number of the gate lines are formed.

Next, an insulating spacer 35 is formed at lateral sides of the gate line. Particularly, the insulating spacer 35 is formed through an etch-back process performed after depositing an oxide layer or a nitride layer on an entire surface including the gate line.

Subsequently, an inter-layer insulating layer is formed on an upper part of the substrate 31 where the insulating spacer 35 is formed. A planarization process is performed until exposing a surface of the hard mask 34 is exposed. The inter-layer insulating layer is then etched with use of a contact mask so as to form a contact isolation layer 36.

Therefore, a first polysilicon layer 37A is deposited on an opening between the gate lines provided by the contact isolation layer 36, e.g., an entire surface including a contact hole by employing a LPCVD technique. This deposition continues until reaching a target deposition thickness $T_1$ as a concentration of implanted dopants gradually increases from the first concentration $C_0$ to the second concentration C.

At this time, the first polysilicon layer 37A deposition is proceeded at a temperature ranging from about 500° C. to about 600° C. by using such gas as SiH$_4$, SiH$_2$Cl$_2$ and so on. Particularly, P is doped with use of PH$_3$ gas, and a concentration of the P gradually increases until reaching a target deposition thickness $T_1$ from an initial deposition thickness $T_0$.

That is, the concentration increases from the first concentration $C_0$ to the second concentration C until reaching the target deposition thickness $T_1$ from the substrate 31 contacting to the first polysilicon layer 37A. At this time, the first concentration $C_0$ ranges from about $5 \times 10^{18}$ dopants/cm$^3$ to about $1 \times 10^{20}$ dopants/cm$^3$, while the second concentration C ranges from about $1 \times 10^{20}$ dopants/cm$^3$ to about $3 \times 10^{20}$ dopants/cm$^3$.

For instance, in case that the complete deposition thickness $T_2$ of the polysilicon layer, i.e., the contact plug, ranges from about 3000 Å to about 3500 Å, the first polysilicon layer 37A is deposited to a thickness of about 500 Å to about 1000 Å. Also, a low quantity of the doping gas, i.e., PH$_3$, is added during the first polysilicon layer 37A deposition so as to reach the first concentration $C_0$, and then, the PH$_3$ is increasingly added so that the doping concentration within the first polysilicon layer 37A becomes the second concentration C.

Referring to FIG. 6B, after completing the first polysilicon layer 37A deposition, a second polysilicon layer 37B is deposited until reaching the complete deposition thickness $T_2$. At this time, the first and the second polysilicon layers 37A and 37B are deposited under an in-situ environment by using a LPCVD technique. The reason for classifying the polysilicon layer into the first and the second polysilicon layers 37A and 37B is to show deposition procedures according to flow quantity changes in the doping gas so that there result in different doping concentrations of P for the first concentration $C_0$ and the second concentration C.

Hence, once the doping concentration of P implanted into the first polysilicon layer 37A reaches to the second concentration C, the second polysilicon layer 37B is deposited until having the complete deposition thickness $T_2$. At this time, the flow quantity of the PH$_3$ gas does not change in order to maintain the second concentration C consistent until reaching to the complete deposition thickness $T_2$.

Eventually, compared to the first polysilicon layer 37A deposition, a high flow quantity of the PH$_3$ gas is consistently added during the second polysilicon layer 37B deposition so that the doping concentration of P is maintained consistently to be the second concentration C within the second polysilicon layer 37B. At this time, the flow quantity of PH$_3$ gas is remained the same quantity added to reach the second concentration C from the first concentration $C_0$ used for obtaining the target deposition thickness $T_1$. Herein, the second concentration C ranges from about $1 \times 10^{20}$ dopants/cm$^3$ to about $3 \times 10^{20}$ dopants/cm$^3$.

Referring to FIG. 6C, the first and the second polysilicon layers 37A and 37B are proceeded with a chemical mechanical polishing (CMP) process or an etch-back process so as to form a polysilicon plug 37 wherein a surface of the opening is planarized.

The polysilicon plug 37 is classified into the first polysilicon layer 37A having a incremental concentration distribution wherein a low concentration of P gradually increases and the second polysilicon layer 37B having a uniform concentration distribution wherein a high concentration of P is added and consistently maintained throughout. That is, the polysilicon plug 37 has a double doping distribution.

It is possible to minimize diffusions of P during a subsequent thermal process by forming the polysilicon plug 37 having the double doping distribution. Simultaneously, it is also possible to prevent an increase in resistance of the polysilicon plug 37. In other words, the P does not diffuse into parts to which the high concentration of P is added but only into parts proximate to the substrate 31 during the thermal process. As a result, it is possible to prevent an increase of contact resistance by minimizing a decrease of the doping concentration of P.

Although FIGS. 6A to 6C provide the preferred embodiment using the polysilicon plug, it is still possible to form a double doping distribution using polysilicon germanium as the contact plug. Compared to the polysilicon plug, this substitution provides an effect of further decreasing the resistance based on the known fact that the polysilicon germanium has the resistance lower than the polysilicon.

By following the preferred embodiment of the present invention, it is possible to improve a degree of integration through the realization of a cell plug process capable of suppressing diffusions of P and providing a low resistance.

While the present invention has been described with respect to certain preferred embodiments, it will be apparent to those skilled in the art that various changes and modifications may be made without departing from the scope of the invention as defined in the following claims.

What is claimed is:

1. A method for forming a contact plug in a semiconductor device, comprising the steps of:
   forming a contact isolation layer on a substrate, the contact isolation layer having an opening exposing a partial portion of the substrate;
   depositing a conductive layer within the opening of the contact isolation layer;
   doping dopants in a manner to allow the conductive layer to have different doping distributions with respect to a thickness; and
   forming a contact plug within the opening through a planarization process applied to the conductive layer,
   wherein the step of doping the dopants further includes:
   a first step of doping the dopants until reaching a target deposition thickness by gradually increasing a concentration of the dopants from a first concentration to a second concentration for an interval between an initial conductive layer deposition and the target deposition thickness; and
   a second step of doping the dopants in a manner that the second concentration is consistently maintained throughout for an interval from the target deposition thickness to a complete deposition thickness.

2. The method as recited in claim 1, wherein, at the first step, a flow quantity of a doping gas initially added is low and is gradually increased so that the doping concentration of the dopants increases from the first concentration to the second concentration.

3. The method as recited in claim 2, wherein the doping gas is $PH_3$ gas.

4. The method as recited in claim 1, wherein, at the second step, a high flow quantity of a doping gas is added and remained the same throughout so that the doping concentration of the dopants is consistently maintained to be the second concentration.

5. The method as recited in claim 1, wherein the complete deposition thickness after depositing the conductive layer ranges from about 3000 Å to about 3500 Å, and the target deposition thickness ranges from about 500 Å to about 1000 Å.

6. The method as recited in claim 1, wherein the first concentration ranges from about $5 \times 10^{18}$ dopants/cm$^3$ to about $1 \times 10^{20}$ dopants/cm$^3$, and the second concentration ranges from about $1 \times 10^{20}$ dopants/cm$^3$ to about $3 \times 10^{20}$ dopants/cm$^3$.

7. The method as recited in claim 1, wherein the conductive layer is selected from a group consisting of a polysilicon layer and a polysilicon germanium layer.

8. A method for forming a contact plug in a semiconductor device, comprising the steps of:
   forming a contact isolation layer on a substrate, the contact isolation layer having an opening exposing a partial portion of the substrate;
   depositing a conductive layer within the opening of the contact isolation layer; and
   forming a contact plug within the opening through a planarization process applied to the conductive layer,
   wherein the step of depositing the conductive layer includes a step of doping dopants in a manner to allow the conductive layer to have different doping distributions with respect to a thickness of the conductive layer,
   wherein the step of doping the dopants further includes:
   a first step of doping the dopants until reaching a target deposition thickness by gradually increasing a concentration of the dopants from a first concentration to a second concentration for an interval between an initial conductive layer deposition and the target deposition thickness; and
   a second step of doping the dopants in a manner that the second concentration is consistently maintained throughout for an interval from the target deposition thickness to a complete deposition thickness.

9. The method as recited in claim 8, wherein, at the first step, a flow quantity of a doping gas initially added is low and is gradually increased so that the doping concentration of the dopants increases from the first concentration to the second concentration.

10. The method as recited in claim 9, wherein the doping gas is $PH_3$ gas.

11. The method as recited in claim 8, wherein, at the second step, a high flow quantity of a doping gas is added and remained the same throughout so that the doping concentration of the dopants is consistently maintained to be the second concentration.

12. The method as recited in claim 8, wherein the complete deposition thickness after depositing the conductive layer ranges from about 3000 Å to about 3500 Å, and the target deposition thickness ranges from about 500 Å to about 1000 Å.

13. The method as recited in claim 8, wherein the first concentration ranges from about $5 \times 10^{18}$ dopants/cm$^3$ to about $1 \times 10^{20}$ dopants/cm$^3$, and the second concentration ranges from about $1 \times 10^{20}$ dopants/cm$^3$ to about $3 \times 10^{20}$ dopants/cm$^3$.

14. The method as recited in claim 8, wherein the conductive layer is selected from a group consisting of a polysilicon layer and a polysilicon germanium layer.

* * * * *